(12) United States Patent
Stevens et al.

(10) Patent No.: US 6,730,899 B1
(45) Date of Patent: May 4, 2004

(54) REDUCED DARK CURRENT FOR CMOS IMAGE SENSORS

(75) Inventors: Eric G. Stevens, Webster, NY (US); Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/340,487

(22) Filed: Jan. 10, 2003

(51) Int. Cl.[7] ................ H01L 27/00; H01L 31/062
(52) U.S. Cl. ................ 250/208.1; 250/214.1; 257/292
(58) Field of Search ............ 250/208.1, 214.1; 257/290, 291, 292, 293, 232, 233, 461, 463

(56) References Cited

U.S. PATENT DOCUMENTS 6,100,551 A * 8/2000 Lee et al. ............... 257/232
6,184,055 B1 * 2/2001 Yang et al. ............... 438/57

* cited by examiner

*Primary Examiner*—Kevin Pyo
(74) *Attorney, Agent, or Firm*—Peyton C. Watkins

(57) ABSTRACT

A CMOS image sensor comprises a substrate of a first conductivity type, a photodetector for capturing incident light and converting it to a charge; a transfer gate for passing the charge from the photodetector; and a region of the first conductivity type of enhanced conductivity in the substrate which extends substantially along an entire length and width of the transfer gate.

9 Claims, 3 Drawing Sheets

REDUCED DARK CURRENT FOR CMOS IMAGE SENSORS

FIELD OF THE INVENTION

The invention relates generally to the field of CMOS image sensors and, more particularly, to such image sensors having transfer gates having regions of enhanced conductivity in the substrate as defined by the area of the transfer gate.

BACKGROUND OF THE INVENTION

Referring to FIG. 1, prior art CMOS image sensors 10 are solid state imagers built in a substrate 5 wherein each pixel typically contains a photo-sensing region 20, a reset transistor 30, a charge transfer region 40, a transfer gate electrode 45 separated from the substrate 5 by an insulating layer 42, a charge to voltage conversion region 50, and an amplifier 60. In these CMOS sensors, dark current is generated in several regions of the device. Such prior art devices have addressed dark current reduction in the photo-sensing region 20. Another region of dark current generation is the charge transfer region 40.

With typical processing and design, and due to short-channel effects, the charge transfer region 40 of current day CMOS image sensors is basically the channel region of a "normally on", or depletion-mode type NMOSFET. Unlike CCD based imaging systems, typical power supplies used in these CMOS systems are unipolar, (e.g.,+3.3V). As such, the "off" state voltage on the transfer gate 45 of the CMOS sensor 10 is limited to a minimum of 0V (ground). Therefore, since the transfer gate's surface is not "turned off", a relatively high amount of dark current is generated in this region. This dark current, or a portion thereof, may leak into the photodiode during the integration period causing excess noise, thereby limiting the imaging performance of the device. To avoid this, it is desirable to provide a charge transfer region 40 whose surface region will be accumulated (with holes) in the off state (Vg=0V) so as to quench this excess dark-current generation.

SUMMARY OF THE INVENTION

The present invention is directed to overcoming one or more of the problems set forth above. Briefly summarized, according to one aspect of the present invention, the invention resides in a CMOS image sensor comprising (a) a substrate of a first conductivity type; (b) a photodetector for capturing incident light and converting it to a charge; (c) a transfer gate for passing the charge from the photodetector; and (d) a region of the first conductivity type of enhanced conductivity in the substrate which extends substantially along an entire length and width of the transfer gate.

These and other aspects, objects, features and advantages of the present invention will be more clearly understood and appreciated from a review of the following detailed description of the preferred embodiments and appended claims, and by reference to the accompanying drawings.

Advantageous Effect Of The Invention

The present invention has the following advantages of reducing dark current generated in the area of the transfer gate of a CMOS image sensor for reduced noise, increased dynamic range and overall improvement in image quality.

DETAILED DESCRIPTION OF THE INVENTION

Figure 1:
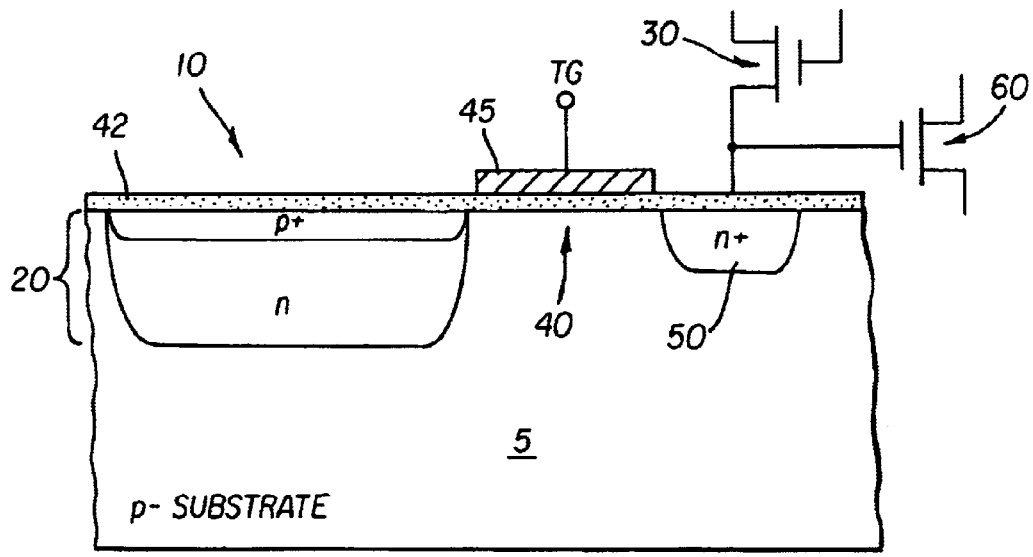
FIG. 1 is a prior art CMOS image sensor.
Figure 2:
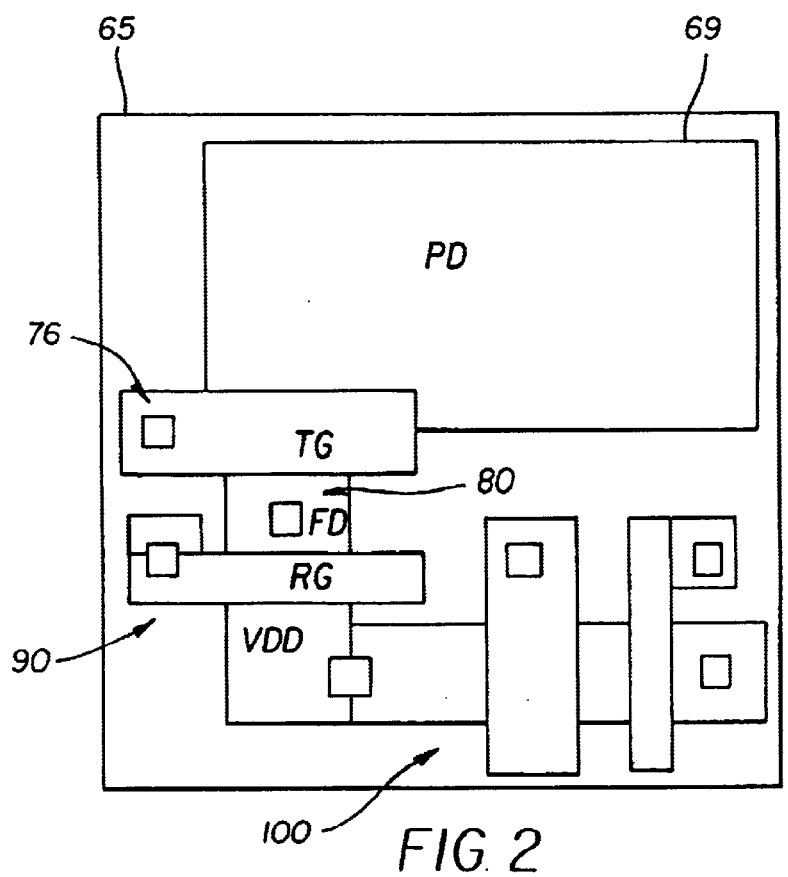
FIG. 2 is a top view of the CMOS image sensor of the present invention.
Figure 3:
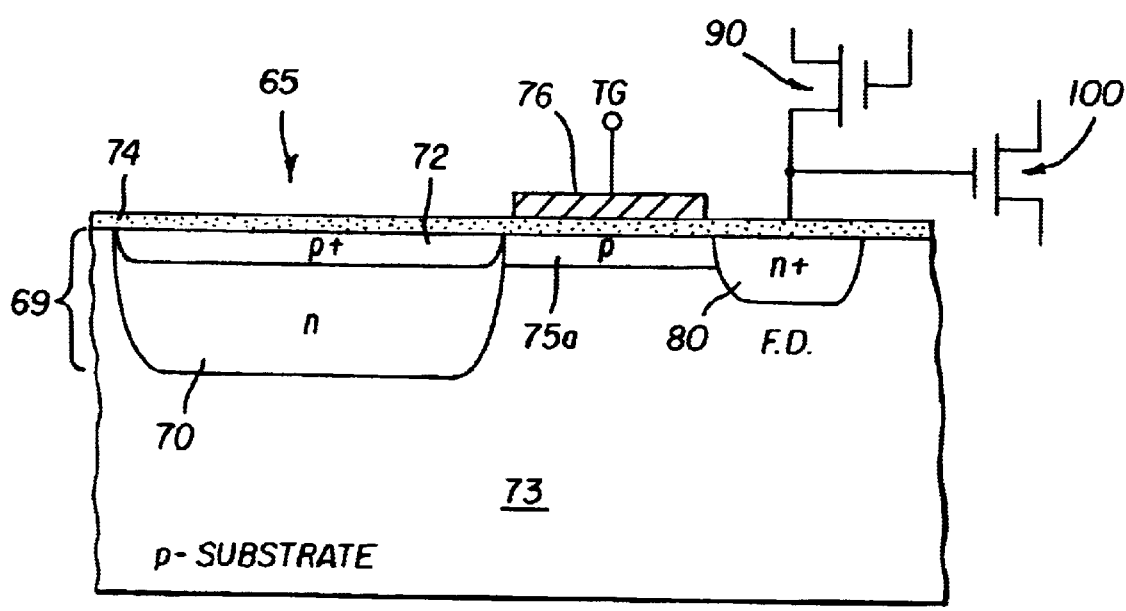
FIG. 3 is a side view of the CMOS image sensor of the present invention.

Referring to FIGS. 2 and 3, there is shown the present invention CMOS solid-state image sensor 65 are built in a substrate 73 wherein each pixel typically contains a photo-sensing region 69 for collecting incident light and converting this light to a charge during an integration period. This photo-sensing region 69 may be a photodiode or a pinned photodiode, which is shown in FIG. 3 as a preferred embodiment. In the case of a pinned photodiode, a pinning layer 72 of the same conductivity type as the substrate is positioned atop a photodiode implant 70. The photodiode implant 70 is of the opposite conductivity type to the substrate 73. The sensor also includes a transfer region 75a of enhanced conductivity relative to that of the substrate 73 and a transfer gate electrode 76. The transfer gate electrode 76 is separated from the substrate 73 by insulating materials 74. When the transfer gate electrode 76 is pulsed, charge is transferred from the photo-sensing region 69 to a charge to voltage conversion region 80 whose potential was previously reset to a reference level by a reset transistor 90. An amplifier 100 is connected to the charge to voltage conversion region 80 for buffering the voltage to other circuitry on the chip, as is well known in the art.

It is instructive to note, as previously stated, that the transfer region 75a is of enhanced conductivity relative to that of the substrate 73 for the purpose of reducing dark current generated in the area of the transfer gate. This reduced dark current provides reduced noise, increased dynamic range and overall improvement in image quality. It is noted that the substrate 73 is preferably of p-type conductivity and that the transfer region 75a is preferably of additional dopant of the same type as the substrate 73, p-type conductivity in this embodiment.

Figure 4:
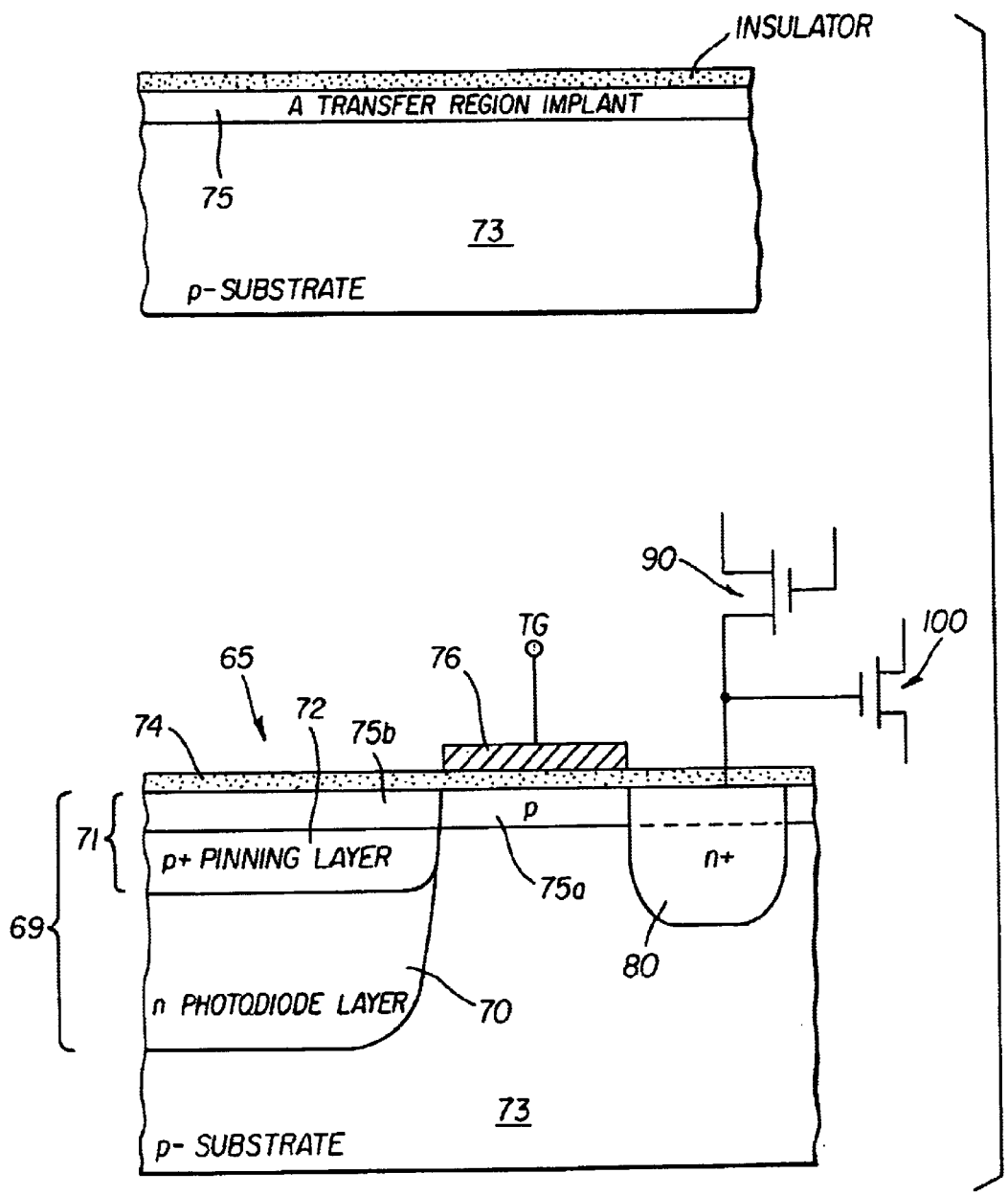
FIG. 4 is an alternative embodiment of the present invention.

Referring to FIG. 4, there is shown an alternative embodiment of the present invention. In this embodiment, the enhanced p-type conductivity layer 75 extends substantially a length and width of the pinning layer 72 (typically formed by ion implantation) and becomes a portion of a pinning region 71. The enhanced conductivity layer 75 includes a transfer region 75a and another portion 75b where the portion 75b is in the photo-sensing region 69. It is noted that the pinning region 71 is formed by the combination of the pinning layer 72 and enhanced p-type conductivity layer 75b.

The invention has been described with reference to a preferred embodiment. However, it will be appreciated that variations and modifications can be affected by a person of ordinary skill in the art without departing from the scope of the invention.

PARTS LIST 5 prior art substrate
10 prior art image sensor
20 prior art photo-sensing region
30 prior art reset transistor
40 prior art charge transfer region
42 prior art insulating layer
45 prior art transfer gate electrode
50 prior art charge to voltage conversion region
60 prior art amplifier 65 CMOS solid-state image sensor
69 photo-sensing region
70 photodiode implant
71 pinning region
72 pinning layer
73 substrate
74 insulating materials
75 enhanced p-type conductivity layer
75a transfer region
75b another portion
76 transfer gate electrode
80 charge to voltage conversion region
90 reset transistor
100 amplifier

What is claimed is:

1. A CMOS image sensor comprising:
   (a) a substrate of a first conductivity type;
   (b) a photodetector for capturing incident light and converting it to a charge;
   (c) a transfer gate for passing the charge from the photodetector; and
   (d) a region of the first conductivity type of enhanced conductivity in the substrate which extends substantially along an entire length and width of the transfer gate.

2. The CMOS image sensor as in claim 1, wherein the first conductivity type is p type.

3. The CMOS image sensor as claim 1, wherein the photodetector is a photodiode.

4. The CMOS image sensor as claim 1, wherein the enhanced conductivity includes adding additional dopant of the first conductivity type.

5. The CMOS image sensor as in claim 1 further comprising a sense node for receiving the charge from the photodetector.

6. The CMOS image sensor as in claim 1 wherein the photodetector is a pinned photodiode which includes a pinning layer of the first conductivity type.

7. The CMOS image sensor as in claim 6, wherein the region of enhanced conductivity extends substantially a length and width of the pinning layer and becomes a portion of the pinning layer.

8. The CMOS image sensor as in claim 1, wherein the region of enhanced conductivity is doped so that it substantially eliminates any dark current contribution due to the transfer gate.

9. The CMOS image sensor as in claim 1, wherein the region of the first conductivity type of enhanced conductivity is at a surface of the substrate.

* * * * *